United States Patent [19]

Black

[11] 4,017,791
[45] Apr. 12, 1977

[54] METHOD AND APPARATUS FOR MEASURING VARIATIONS IN MAGNETIC FIELD ORIENTATIONS

[75] Inventor: Robert M. Black, Ocean City, N.J.
[73] Assignee: Airmag Surveys, Inc., Philadelphia, Pa.
[22] Filed: July 11, 1974
[21] Appl. No.: 487,609
[52] U.S. Cl. .................................. 324/43 R
[51] Int. Cl.² ................................ G01R 33/04
[58] Field of Search .......... 324/43 R, 4, 8; 318/647, 648, 649; 33/316, 319, 318, 326, 356, 361

[56] References Cited

UNITED STATES PATENTS

| | | | |
|---|---|---|---|
| 2,468,554 | 4/1949 | Hull | 324/43 R |
| 2,518,513 | 8/1950 | Wyckoff | 324/43 R |
| 2,555,209 | 5/1951 | Vacquier et al. | 324/43 R |
| 2,808,656 | 10/1957 | Pirone | 33/317 R |
| 2,930,973 | 3/1960 | Gilbert | 324/43 R |

OTHER PUBLICATIONS

Owen et al., A Three Component Fluxgate Magnetometer Etc., Conf. Oceanology Internatl. 1972; Brighton, Eng., Mar. 1972; pp. 19–24.

*Primary Examiner*—Robert J. Corcoran
*Attorney, Agent, or Firm*—Weiser, Stapler & Spivak

[57] ABSTRACT

A closed-loop feedback system intermittently orients a gimbaled, quadrature flux gate bearing platform perpendicular to the magnetic field. During intervening periods the loop is opened and a gyroscope preserves this platform orientation. The flux gate outputs during such intervening periods represents changes in field orientation. The output from a conventional magnetometer is used to correct said flux gate outputs for field strength variations.

22 Claims, 2 Drawing Figures

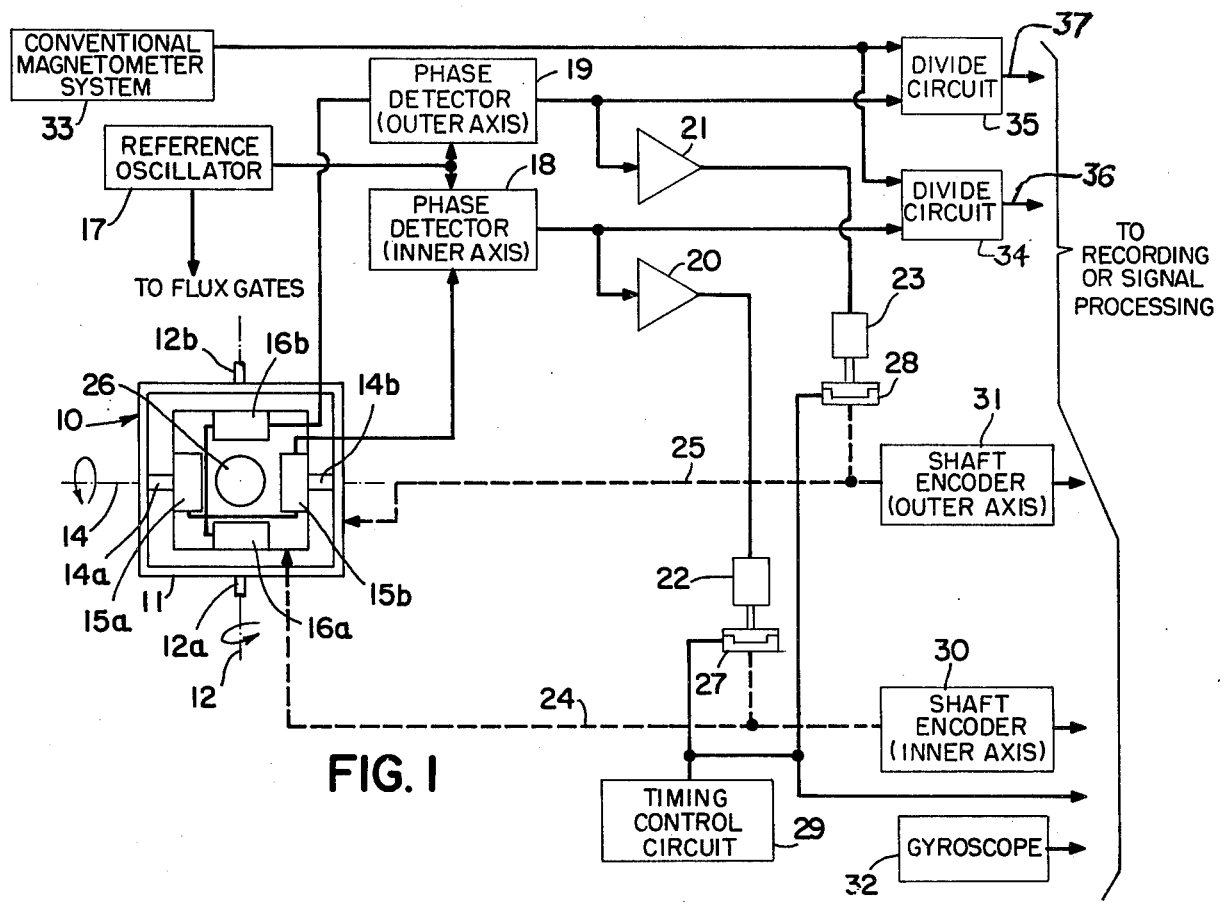
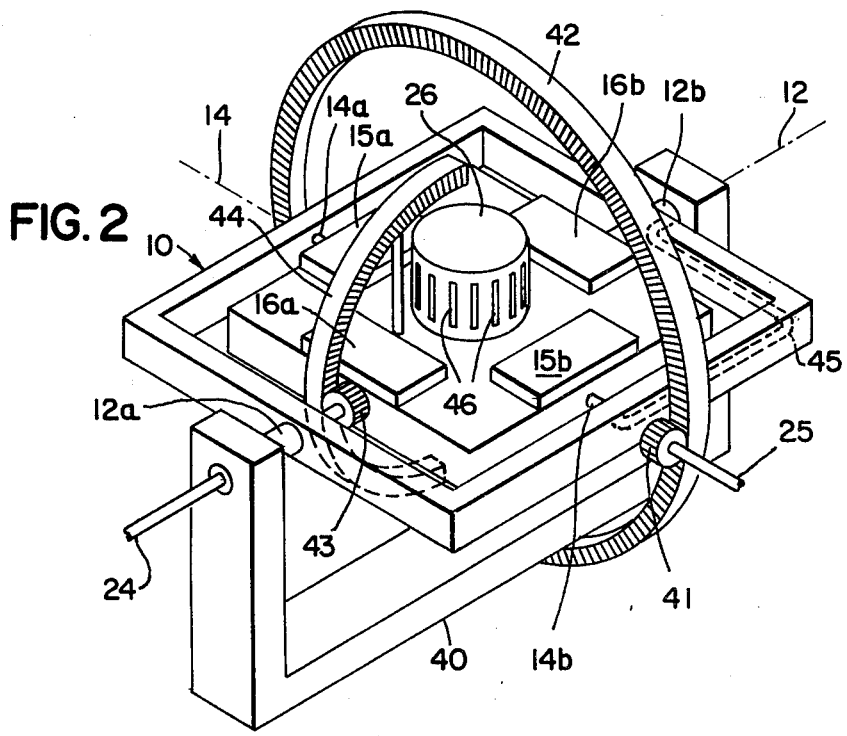

METHOD AND APPARATUS FOR MEASURING VARIATIONS IN MAGNETIC FIELD ORIENTATIONS

BACKGROUND OF THE INVENTION

This invention relates to the measurement of magnetic fields as in magnetic surveying, and particularly to the measurement of such fields with a degree of effectiveness not heretofore conveniently attainable.

It has long been known to perform magnetic surveying in order to determine the general configuration of the earth's magnetic field, as well as more localized features, such as bodies of ore and other subsurface entities influencing the magnetic field. Such surveying has been performed by various techniques. One of these involves the use of so-called flux gate magnetometers. Flux gates are electrically driven saturable-core inductors whose electrical output varies as a function of magnetic field strength parallel to the core. In flux gate magnetometers, quadrature oriented flux gates are used to define a plane perpendicular to the magnetic field to be measured. This is done by using the output from these quadrature flux gates to position them so as to null their outputs. An additional flux gate, perpendicular to the plane so defined, then actually measures the intensity of the field. To make these measurements rapidly over large areas of terrain, the whole installation is normally carried in an airplane, mounted in a boom which protrudes from the plane so as to locate the sensing equipment as far as possible from the magnetic fields associated with the plane itself.

This prior art technique is inherently ineffective to measure one important parameter of the magnetic field, namely changes in its angle of orientation.

The measuring flux gate itself is maintained parallel to the field being measured, and therefore is incapable of providing any angle-representative output. The outputs of the quadrature flux gates defining the plane perpendicular to the field are nulled, and therefore also provide no output useful for angle measurement.

Various expedients have been proposed, which do have the possibility of measuring angular changes. However, these other techniques are also vastly more complex and costly.

BRIEF SUMMARY OF THE INVENTION

Accordingly, it is an object of the invention to provide an improved magnetic field measuring technique.

It is another object to provide an improved magnetic field measuring technique using flux gates for field measurement.

It is still another object to provide a magnetic field measuring technique using flux gate magnetometers, and capable of measuring changes in angle of field orientation.

These and other objects which will appear are achieved in accordance with the invention by utilizing flux gates to define a plane, orienting said plane perpendicularly to the magnetic field during intermittent intervals, preserving the orientation established during any such interval for a period of time irrespective of changes in field strength or orientation, and utilizing variations in the outputs from said flux gates during each period of preserved orientation to indicate charges in field orientation.

BRIEF DESCRIPTION OF THE DRAWINGS

For further details, reference is made to the discussion which follows, in the light of the accompanying drawings wherein FIG. 1 is an over-all system diagram of an embodiment of the invention; and FIG. 2 is a more detailed, though still schematic illustration of portions of the system of FIG. 1.

The same reference numerals are used to designate similar elements in the two figures.

DETAILED DESCRIPTION

FIG. 1, to which reference may now be had, shows a gimbal system 10, which includes an outer gimbal ring 11, pivotable about the outer gimbal axis 12 which is defined by pivots 12a and 12b and indicted by a dot-dash line in FIG. 1. Mounted within outer gimbal ring 11 is inner gimbal plate 13, pivotable about inner gimbal axis 14, which is defined by pivots 14a and 14b and also indicated by a dot-dash line in FIG. 1. A pair of flux gates 15a and 15b is mounted on gimbal plate 13 in such positions as to sense pivoting about inner gimbal axis 14. A second pair of flux gates 16a and 16b is mounted on gimbal plate 13 so as to sense pivoting about outer gimbal axis 12. Each pair of flux gates is positioned symmetrically with respect to the respective pivot axis, in conventional manner, so as to produce a combined output which departs in opposite senses from a reference value as the plane defined by that pair pivots in opposite directions away from perpendicularly to the magnetic field being measured.

Electrical excitation for all the flux gates 15a, 15b, 16a and 16b is provided in conventional manner by reference oscillator 17. The output signal from this reference oscillator 17, with its frequency doubled in conventional manner, if appropriate, is also supplied to each of two phase detectors 18 and 19.

Phase detector 18 is further supplied with the combined output signal from flux gate pair 15a and 15b, while phase detector 19 is supplied with the combined signal from flux gates 16a and 16b.

The result of this is that phase detector 18 produces an output signal which departs from a reference value (which may be zero) in accordance with departures of the magnetic field being measured from perpendicularity to the plane of gimbal plate 13 as defined by its rotation about inner gimbal axis 14. Similarly, phase detector 19 produces an output which departs from its reference value in accordance with departures of the field from perpendicularity to the plane of plate 13 as defined by rotation about outer gimbal axis 12.

The output signal from each of detectors 18 and 19 may then be amplified in conventional amplifiers 20 and 21, respectively. The output signals from these amplifiers are supplied to motors 22 and 23, respectively. These motors, in turn, are mechanically coupled to the inner and outer gimbal axes 12 and 14 so as to produce rotation of said axes under the control of the signals from the amplifiers. These couplings are represented diagrammatically in FIG. 1 by broken lines 24 and 25, respectively. In particular, these amplifier signals are applied to the respective motors so as to cause them to turn the gimbal axes in the directions which reduce the output signals from detectors 18 and 19. In other words, the phase detectors, amplifiers and motors, together, constitute a closed-loop feedback system which tends to keep gimbal plate 13 perpendicular to the orientation of the magnetic field being measured, thereby tending to null the outputs from the phase detectors.

Up to this point, the system of FIG. 1 could be considered conventional.

In accordance with the present invention, further provisions are made as follows. On gimbal plate 13, there is mounted a gyroscope 26 capable of maintaining the orientation of gimbal plate 13 substantially fixed in the absence of rotational forces from motors 22, 23. Clutches 27 and 28 are provided at the drive shaft outputs of motor 22 and 23, respectively. A second gyroscope 32 is also provided and so is a conventional flux gate magnetometer system 33, such as described in the portion of this specification dealing with the prior art.

In operation, clutches 27 and 28 are initially engaged under the control of timing circuit 29, and the closed-loop system previously described thereupon functions to essentially line up gimbal plate 13 perpendicularly to the field being measured, rotating to the extent necessary about the two gimbal axes 12 and 14.

After a period of time sufficiently long for such alignment to have been accomplished, clutches 27 and 28 are both disengaged under the control of timing circuit 29. This opens up the closed feedback loop, and the output signals from detectors 18 and 19 thereupon become ineffective to control the orientation of gimbal plate 13. Instead, gyroscope 26 will in effect take over control of this orientation, and will tend to maintain the plate in generally the same orientation in which it was just before clutches 27 and 28 were disengaged. Any subsequent changes in orientation of the magnetic field will continue to produce changes in the outputs of the flux gates, and these in turn will be detected by phase detectors 18 and 19. Due to the absence of a feedback path to gimbal plate 13 during this disengagement, these changes will not be nulled out, but rather will be manifested by corresponding changes in the output signals from the two phase detectors.

At the same time, the two shaft encoders 30 and 31 provide output signals showing the gimbal axis alignments, gyroscope 32 provides an output signal constituting a fixed reference in three-dimensional space, and magnetometer system 33 provides conventional output signals representing total field strength.

Together, all these signals provide sufficient information to establish the orientation of the magnetic field in three-dimensional space with high accuracy.

The output of gyroscope 32 serves as the basic reference. The outputs of shaft encoders 30 and 31, together, represent the initial field orientation, relative to that basic reference, at the start of each period of disengagement of clutches 27 and 28. The outputs of phase detectors 18 and 19 together represent any deviations from the above-mentioned initial field orientation which take place during the period of clutch disengagement. It should be recognized that, if such deviations in field orientation are accompanied by changes in field strength the latter will also contribute to the outputs of phase detectors 18 and 19 during periods of clutch disengagement. The conventional magnetometer system 33 provides in conventional manner an output representing such field strength and its changes, essentially independently of field orientation, and it can therefore be used to cancel out field strength caused changes in the phase detector outputs. The result is that an indication of field orientation changes, essentially uncontaminated by other variables, can be provided by applicant's invention.

In the system of FIG. 1, this may be accomplished by supplying the signal output from magnetometer 33, which represents total field strength, to divider circuits 34 and 35 in the outputs of phase detectors 18 and 19, respectively. It can be shown that, by dividing each phase detector output by the output from magnetometer 33, there will be produced on output lead 36 a signal proportional to the sine of the angle of deviation of the field in the plane defined by inner gimbal plate 13. Likewise on output lead 37 there will be produced a signal proportional to the sine of the field deviation angle in the plane of outer gimbal ring 11.

The manner in which the various outputs discussed immediately above are processed to yield this orientation information inherent therein is well known, and need not be further described. Such processing can be done either directly from the various outputs, or else these can be recorded, e.g. on magnetic tape, and subsequently processed. In aerial surveying, recording followed by later processing is customarily employed. For further details on this subject, reference is made to an article entitled Vector Magnetic Data for Detecting Short Polarity Intervals in Marine Magnetic Profiles, by Richard J. Blakely, Allan Cox and Ernest Iufer; which appeared in the Journal of Geophysical Research on Oct. 10, 1973.

Reengagement of clutches 27 and 28 takes place, under the control of timing circuit 29, a predetermined period of time after disengagement. Upon such reengagement, the motors 22 and 23 again becomes effective to reorient gimbal plate 13 so as to null the signals in the closed-loop orienting system.

In accordance with the invention, there are also supplied, for ultimate use in signal processing, the timing signals from circuit 29 which correspond to disengagement and reengagement of clutches 27 and 28. This makes it possible during signal processing to know when the closed feedback loop is functioning and when it is not.

Disengagement and reengagement of the clutches alternate, preferably in a suitable periodic sequence. During each period of clutch engagement, the gimbal plate is realigned perpendicularly to the magnetic field. During each period of disengagement, the gimbal plate remains fixed and deviations of field orientation are measured.

Further details of an embodiment of the gimbal system 10 of FIG. 1 are shown in FIG. 2, to which reference may now be had. As shown there, the outer gimbal pivots 12a and 12b are journaled within a suitable mounting frame 40. Shaft 25 drives the outer gimbal ring 11 through pinion 41 and ring gear 42. Inner gimbal pivots 14a and 14b are journaled within outer gimbal ring 11. Shaft 24 drives inner gimbal plate 13 through pinion 43 and segment gear 44. Shaft 24 passes concentrically through pivot 12a to reach pinion 43. Gyroscope 26 is mounted on plate 13. This is preferably an air-driven gyroscope, to eliminate the magnetic effects associated with electric drives. It is also preferably of non-magnetic construction. Driving air is supplied via the hollow interiors of pivots 12b and 14b and a duct 45 (shown in broken lines in FIG. 2) within outer gimbal ring 11. Ports 46 in the gyroscope housing provide exhausts for the driving air. These ports are preferably adjustable so that the escaping air exerts a small force on the gyroscope, of magnitude and orientation sufficient to cancel the precession due to rotation of the earth.

The system of FIGS. 1 and 2 not only provides measurements of changes in orientation of the magnetic field, but does so with high sensitivity. These measurements take the form of departures of the phase detector outputs from their nulled values, at which they had been established just before each measurement period by the operation of the previously closed feedback loop. This is the region of the system characteristic in which a given change in the field produces the greatest change in the output. It is also the region of highest signal-to-noise ratio.

It will be understood that the individual elements of the system described may take various specific, known forms, and that other variations will also occur to those skilled in the art, without departing from the scope of this invention.

I claim:

1. A system for measuring variations in magnetic field orientations comprising:
   means for intermittently establishing a reference value for said variations, including
   means for sensing field orientation, and
   means for establishing the orientation of said sensing means in a predetermined angular relation to said field; and
   means for measuring, during a period following each said etablishment, departures from said reference value corresponding to variations in said field during the period, said measuring means including
   a gimbaled platform bearing flux gates defining a plane,
   means for detecting variations in the outputs of said flux gates,
   intermittently operable means for utilizing said detected variations to orient said platform so as to null said variations, said intermittently operable means comprising gimbal drives for said platform controlled by said detecting means, and means for decoupling said drive means for said platform,
   means for preserving said platform so oriented between said intermittent operations, said preserving means including a gyroscope mounted on said platform, and
   means for deriving indications of said flux gate outputs between said intermittent operations.

2. The system of claim 1, wherein said angular relation is that of perpendicularity.

3. The system of claim 1, comprising means responsive to said drive means to sense the orientation of said platform at the time of said decoupling.

4. The system of claim 1, comprising means for detecting the absolute magnitude of said field, and means for utilizing said detected magnitude to modify said indications of flux gate outputs between said intermittent operations.

5. The system of claim 4, wherein said utilizing means comprises means for forming a ratio of a value representing each said output to a value representing said total field.

6. In a system for measuring variations in magnetic field orientations, which system includes a plurality of differently oriented flux sensing means, means for deriving output signals from the sensing means which vary as functions of the sensed flux, and first means for utilizing said output signals to control the orientations of the sensing means relative to the field, the improvement which comprises:
   means for alternately enabling and disabling the first signal utilizing means;
   means functioning independently of said output signals for stabilizing the orientations of the sensing means during the intervals of disabling of the utilizing means and the second means for utilizing the output signals during the disabling intervals to indicate changes in the orientation of the field-relative to the sensing means.

7. The system of claim 6 wherein
the first utilizing means includes closed-loop feedback paths opposing changes in the orientations of the sensing means relative to the field.

8. The system of claim 7 wherein
the disabling is by interrupting the feedback paths.

9. The system of claim 6 wherein
the stabilizing means is connected and arranged to preserve the orientations of the sensing means at the beginning of each disabling interval.

10. The system of claim 6 wherein
the stabilizing means includes a gyroscope mounted on a common platform with the flux sensing means.

11. The system of claim 10 wherein
the gyroscope runs during both enabling and disabling intervals.

12. The system of claim 11 wherein
the first signal utilizing means is constructed and arranged to override the stabilizing effect of the gyroscope during the enabling intervals.

13. The system of claim 6 further comprising
automatic timing means for the enabling and disabling means.

14. The system of claim 13 further comprising
means for utilizing the timing signals to also control the second signal utilizing means.

15. The system of claim 6 wherein
the sensing means includes flux gates.

16. The system of claim 15 wherein
the flux gates are positioned at right angles to each other.

17. The system of claim 16 wherein
the first signal utilizing means is constructed and arranged to orient the flux gates so as to null their output signals.

18. The system of claim 6 further comprising
additional flux sensing means constructed and arranged to detect variations in total magnetic field strength and means for utilizing the output of the additional sensing means to counteract variations in the output signals from the first sensing means which are a function of variations in total magnetic field strength.

19. A method of measuring changes in magnetic field orientation utilizing a plurality of differently oriented flux sensing means, means for deriving output signals from the sensing means which vary as functions of the sensed flux, and means for utilizing the output signals to control the orientations of the sensing means relative to the field, said method comprising the steps of:
   alternately enabling and disabling the signal utilizing means;
   stabilizing the orientations of the sensing means during the intervals of disabling of the utilizing means and processing the output signals during the disabling intervals to determine changes in the field orientations.

20. The method of claim 19 wherein
the control of orientations of the sensing means by
the output signals includes producing null signals through closed-loop orientations of the flux sensing means.

21. The method of claim 20 wherein the stabilizing includes preserving the closed-loop orientations during the disabling intervals.

22. The method of claim 19 further comprising
measuring the total strength of the field during the disabling intervals; and
utilizing said measurement to modify the derived output signals to counteract the effect of variations in said total field strength.

* * * * *